United States Patent
Itoh et al.

(10) Patent No.: US 7,434,137 B2
(45) Date of Patent: Oct. 7, 2008

(54) RETRANSMISSION ORDERING METHOD, WIRELESS COMMUNICATION SYSTEM, RECEIVER AND TRANSMITTER

(75) Inventors: Katsutoshi Itoh, Tokyo (JP); Taku Nagase, Tokyo (JP)

(73) Assignee: Sony Ericsson Mobile Communications Japan, Inc., Tokyo (JP)

( * ) Notice: Subject to any disclaimer, the term of this patent is extended or adjusted under 35 U.S.C. 154(b) by 626 days.

(21) Appl. No.: 11/085,333

(22) Filed: Mar. 21, 2005

(65) Prior Publication Data

US 2005/0210355 A1  Sep. 22, 2005

(30) Foreign Application Priority Data

Mar. 22, 2004  (JP) .......................... P2004-082118

(51) Int. Cl.
H03M 13/00  (2006.01)
(52) U.S. Cl. .................... 714/755; 714/758; 714/751
(58) Field of Classification Search ................ 714/755, 714/758, 715, 781, 744, 748, 764
See application file for complete search history.

(56) References Cited

U.S. PATENT DOCUMENTS 5,983,382 A * 11/1999 Pauls ........................... 714/744
7,191,384 B2 * 3/2007 Wei et al. ..................... 714/776
7,275,198 B2 * 9/2007 Kim et al. ..................... 714/758
2003/0112870 A1 * 6/2003 Fukuda et al. ............ 375/240.12

* cited by examiner

Primary Examiner—Rehana Perveen
Assistant Examiner—Fritz Alphonse
(74) Attorney, Agent, or Firm—Frommer Lawrence & Haug LLP; William S. Frommer; Thomas F. Presson

(57) ABSTRACT

A wireless communication system wherein frame data is encoded with an outer code and then divided into predetermined number of blocks which are encoded with an inner code into transmission data. In a receiver, a decoder decodes the received transmission data in accordance with the inner code, a retransmission order determining unit determines whether to perform a retransmission order in units of blocks based on the likelihood information (decoded soft-decision value). At this time, the retransmission order determining unit inhibits the retransmission order for the block if the number of inner-code errors in a frame consisting of predetermined number of blocks stays within a limit of what the outer code can correct at a decoder and determines that a retransmission is necessary if the number of inner-code errors in the frame exceeds the limit.

17 Claims, 11 Drawing Sheets

LIKELIHOOD INFORMATION → ABSOLUTE VALUE → AVERAGE VALUE WITHIN BLOCK → EVALUATION VALUE

RETRANSMISSION ORDERING METHOD, WIRELESS COMMUNICATION SYSTEM, RECEIVER AND TRANSMITTER

CROSS REFERENCES TO RELATED APPLICATIONS

The present invention contains subject matter related to Japanese Patent Application JP 2004-082118 filed in the Japanese Patent Office on Mar. 22, 2004, the entire contents of which being incorporated herein by reference.

FIELD OF THE INVENTION

The present invention relates to a wireless communication system for performing error correcting coding to which an outer code and an inner code are applied. More particularly, it relates to a Hybrid ARQ technique for composing and decoding retransmission data.

BACKGROUND OF THE INVENTION

In a case where a communication channel is degraded in a wireless communication system, retransmission control is performed so that communication channel errors decrease. This is known as a name of ARQ (Automatic Repeat reQuest). In an ARQ scheme, a receiver cancels erroneous data and requests a transmitter to retransmit the same data.

As an extension of an ARQ technique, there is a Hybrid ARQ technique which incorporates retransmission processing and encoding (error correcting coding) (see Japanese Patent Laid-Open No. 2002-171245). The Hybrid ARQ technique is such that erroneous data prior to decoding is stored and decode processing is performed after the erroneous data is added to retransmission data received thereafter, for the sake of effective reuse of the signal component included in the preceding erroneous data.

FIG. 9 is a block diagram showing an exemplary configuration of a transmitter 300 for realizing a conventional retransmission scheme.

An error detecting code unit 301 adds an error detecting code to user data. The error detecting code includes typically Cyclic Redundancy Check (CRC). Next, an encoder 302 encodes the data, providing redundancy for the data. This encoding uses typically a convolutional code or a turbo code. The data encoded by the encoder 302 is temporarily stored in a retransmission buffer 303. A modulator 304 modulates the encoded data, and a transmitting/receiving unit 305 transmits the modulated data as transmission data. The data is converted to a radio frequency band by the transmitting/receiving unit 305 in the case of wireless transmission. A demodulator 306 demodulates the data received from the transmitting/receiving unit 305, and retransmission control information is extracted from the demodulated data. If the extracted data is ACK (data correctly received), a retransmission controller 307 clears the retransmission buffer 303 and transmits new data. If the extracted data is NACK (retransmission order), the data in the retransmission buffer 303 is modulated again and retransmitted.

FIG. 10 is a block diagram showing an exemplary configuration of a receiver 400, which corresponds to the transmitter 300 of FIG. 9, for realizing a conventional retransmission scheme. The transmission data received by a transmitting/receiving unit 401 is detected and demodulated by a demodulator 402. Soft-decision data outputted from the demodulator 402 is temporarily stored in a composition buffer 403. If there exists past transmission data received from the transmitter, the past transmission data is added to the transmission data and the content of the composition buffer 403 is updated. A decoder 404 decodes the output of the composition buffer 403. An error detector 405 detects an error of the demodulated and decoded data using the error detecting code. If the error detector 405 determines that there is no error, the error detector 405 outputs the user data, clears the composition buffer 403, and transmits ACK (data correctly received). The result of the error detection is sent to a retransmission order controller 406. The retransmission order controller 406 transmits NACK (retransmission order) if an error is detected by the error detector 405.

With the configuration as described, error-free data transmission with less retransmission can be achieved.

On the other hand, there is a scheme for performing error correcting doubly to improve resistance to transmission line errors. In the scheme as mentioned, a structure in which an outer code corrects an error produced in an inner code provides enhanced resistance to transmission line errors.

FIG. 11 is a block diagram showing an exemplary configuration of a transmitter 500 that uses a scheme for performing error correcting doubly.

New user data to be transmitted is temporarily stored in a retransmission buffer 501. If data to be transmitted is new data, the transmitter 500 transmits the stored data. If data to be transmitted is retransmission data, the transmitter 500 transmits the past stored data. An error detecting code unit 502 adds an error detecting code (such as CRC) to transmission data. An encoder 503 encodes the transmission data to which the error detecting code is added, using an error correcting code of an outer code. A Reed-Solomon code, a Bose-Chaudhuri-Hocquenghem code (BCH code), etc. are used as the outer code. The data encoded by the encoder 503 is divided into M blocks at a frame dividing unit 504. An encoder 505 encodes each of the divided data using a second error correcting code of an inner code. A convolutional code, a turbo code, etc. are used as the inner code. The data encoded by the encoder 505 is modulated by a modulator 506, and the modulated data is transmitted to a transmission line through a transmitting/receiving unit 507. The data received by the transmitting/receiving unit 507 is demodulated by the demodulator 508, and the resulting data is sent to a retransmission controller 509. The retransmission controller 509 extracts a retransmission ordering message from the demodulated data. If the message is ACK, the retransmission controller 509 clears the retransmission buffer 501 in which the past transmission data is stored and transmits new data. If the message is NACK, the retransmission data stored in the retransmission buffer 501 is transmitted.

FIG. 13 shows schematically a relationship between the frame data and the divided blocks in the transmitter 500. Frame data 701 is stored in the retransmission buffer 501, and the error detecting code is added to the frame data 701. The encoder 503 encodes the frame data 701 using the outer code to make encoded data 702. The frame dividing unit 504 divides the encoded data 702 into M blocks 703. The encoder 505 encodes each divided block using the inner code to make encoded blocks 704.

FIG. 12 is a block diagram showing an exemplary configuration of a receiver 600 corresponding to the transmitter 500 of FIG. 11.

A signal received by a transmitting/receiving unit 601 is detected and demodulated by a demodulator 602. A decoder 603 decodes each of the divided blocks (encoded blocks 704) of the received signal. A frame combining unit 604 combines M blocks of the decoded data and creates a data frame which is further decoded at a decoder 605. An error detector 607 determines whether there is an error in the decoded data using the error detecting code. If there is no error, the error detector 607 outputs the decoded data as user data. The retransmission order controller 608 creates ACK if the error detector 607 determines that there is no error, or NACK if the error detector 607 detects an error. A modulator 609 modulates a retransmission control message, and a transmitting/receiving unit 601 transmits the message.

With the configuration as described, resistance to transmission line errors can be increased.

However, there is a problem described below in the case where the retransmission scheme is applied to a communication system that contains both inner and outer codes.

That is, in the case of performing a retransmission order for an outer-code error, data that is determined to have no inner-code error is also retransmitted; therefore, it does not necessarily lead to improvement of transmission efficiency.

Further, there may be a case where a retransmission order is performed in units of divided blocks for an inner-code error. In this case, if retransmission orders are performed for all inner codes, there occur some retransmission orders for errors that can be corrected with outer-code error correction; therefore, it does not lead to improvement of transmission efficiency, either.

SUMMARY OF THE INVENTION

Under the circumstances, the present invention addresses the above-mentioned problem by providing a retransmission ordering method, a wireless communication system, a receiver and a transmitter that can improve transmission efficiency in the case of performing error correcting coding to which an outer code and an inner code are applied.

One embodiment of the present invention is directed to a retransmission ordering method in a receiver for receiving transmission data by wireless, frame data being encoded with an outer code and then divided into predetermined number of blocks which are encoded with an inner code into the transmission data. The retransmission ordering method has the steps of receiving transmission data; storing the received transmission data in a buffer; decoding the transmission data stored in the buffer in accordance with the inner code and outputting a decode result and likelihood information thereof (decoded soft-decision value); creating frame data by combining the decoded blocks; decoding the frame data in accordance with the outer code; determining whether or not to perform a retransmission order in units of blocks based on the likelihood information; and transmitting a retransmission order for an applicable block if it is determined that a retransmission is necessary according to the step of determining whether or not to perform a retransmission order. At the step of determining whether or not to perform a retransmission order, the retransmission order for the block is inhibited if the number of inner-code errors in a frame composed of the predetermined number of blocks stays within a limit of what the outer code can correct and it is determined that a retransmission is necessary if the number of inner-code errors in the frame exceeds the limit.

In the retransmission ordering method according to the embodiment of the present invention, in the case of performing a retransmission order in units of divided blocks for an inner-code error at the time of receiving transmission data that are double encoded with outer and inner codes for error correcting, it is determined based on the likelihood information whether or not to perform the retransmission order. More specifically, the retransmission order for the block is inhibited if the number of inner-code errors in a frame composed of the predetermined number of blocks stays within a limit of what the outer code can correct and it is determined that a retransmission is necessary if the number of inner-code errors in the frame exceeds the limit. Thus, the receiver does not perform retransmission orders for all of the divided blocks for which the inner code cannot perform error correcting, but by utilizing error correction capability of the outer code effectively, the retransmission order for a divided block can be prevented from occurring. Therefore, the wasting of wireless communication resources can be avoided.

In the step of determining whether or not to perform a retransmission order, an average value of absolute values of the likelihood information within a block is calculated as an evaluation value. It can be determined whether or not the block needs to be retransmitted by comparing the evaluation value with a predetermined threshold value. That is, it can be properly determined whether or not the block needs to be retransmitted by employing a known relationship between the evaluation value and the number of bit errors in the block.

As for the evaluation value, the number of bits that lead to absolute values of the likelihood information (decoded soft-decision values) that are not more than a specified threshold value may be calculated as an evaluation value.

More specifically, an evaluation value corresponding to the number of errors N/M allocated to each inner code can be the predetermined threshold value in the case where error correction capability of the outer code can correct N errors and one piece of frame data is divided into M pieces.

The retransmission ordering method, an error detecting code being added to the frame data which is then encoded with the outer code, may further have the steps of performing error detection for a decode result in accordance with the error detecting code after frame data obtained by decoding in accordance with the inner code is decoded in accordance with the outer code; and changing the predetermined threshold value in units of data frames in such a way that the retransmission order for the block occurs easily if an error is detected in the step of performing error detection and in such a way that the retransmission order for the block hardly occurs if no error is detected. In this way, the predetermined threshold value is dynamically changed in units of data frames, and thereby adjusted appropriately in such a manner that an incidence of an outer-code error accords with an operational target of data communication.

The retransmission ordering method may further have the step of changing the predetermined threshold value in units of blocks in a data frame using a threshold adjustment (initial value: 0) updated by updating the number of errors N/M allocated to each inner code, based on the number of accumulated errors as to sequential blocks in one data frame. Thus, the threshold value can be controlled for each block appropriately in accordance with an estimated value of quality of the received blocks in an outer-code frame. Therefore, retransmission of unnecessary inner-code blocks can be avoided.

The retransmission ordering method, an error detecting code being added to the frame data which is then encoded with the outer code, may further have comprise the steps of performing error detection for a decode result in accordance with the error detecting code after frame data obtained by decoding in accordance with the inner code is decoded in accordance with the outer code; and transmitting a retransmission order for applicable frame data in accordance with an error detection result in the step of performing error detection.

A wireless communication system according to another embodiment of the present invention includes a transmitter and a receiver. After encoding frame data with an outer code, the transmitter divides the frame data into predetermined number of blocks which are further encoded with an inner code, and the transmitter transmits the encoded data to the receiver by wireless. The receiver receives the transmitted data, stores the received data in a buffer, decodes transmission data stored in the buffer in accordance with the inner code, creates frame data by combining the decoded blocks, decodes the frame data in accordance with the outer code, outputs a decode result and likelihood information thereof (decoded soft-decision value), determines whether or not to perform a retransmission order in units of blocks based on the likelihood information, and transmits a retransmission order for an applicable block if it is determined that a retransmission is necessary based on the determining whether or not to perform a retransmission order, and in the case of determining whether or not to perform a retransmission order, the receiver inhibits the retransmission order for the block if the number of inner-code errors in a frame composed of the predetermined number of blocks stays within a limit of what the outer code can correct and determines that a retransmission is necessary if the number of inner-code errors in the frame exceeds the limit.

The present invention further provides a receiver and a transmitter in the wireless communication system.

According to the present invention, since the error correction capability of the outer code is incorporated into retransmission ordering for an inner-code block, efficient retransmission orders can be performed in a communication system that contains the outer and inner codes.

Further, performing the retransmission order employing inner-code decoded likelihood negates the need to add an error detecting code for the inner code.

Furthermore, determining the retransmission order for the inner code appropriately according to an error state of the outer code enables optimizing the retransmission order for the inner-code block and adjusting appropriately in such a manner that an incidence of an outer-code error accords with an operational target of data communication. Furthermore, in the case of performing the retransmission order for the outer code, the number of retransmissions of the outer codes of high retransmission overhead can be properly controlled. Thus, wireless communication resources can be used effectively.

Moreover, determining the retransmission order appropriately for each inner-code block constituting a data frame can avoid the retransmission of unnecessary inner-code blocks. Thus, wireless communication resources can be used effectively.

Other and further objects, features and advantages of the invention will appear more fully from the following description.

DETAILED DESCRIPTION OF THE PREFERRED EMBODIMENTS

The following is a detailed description of preferred embodiments of the present invention.

Figure 1:
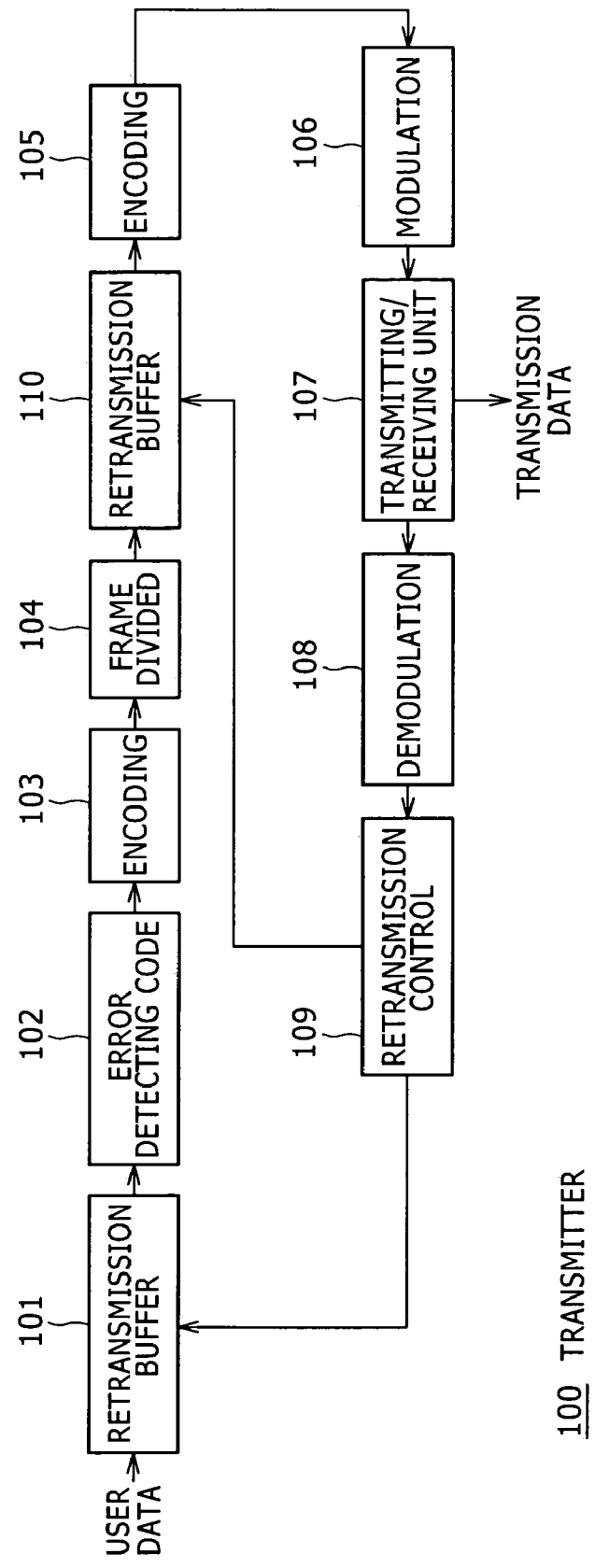
FIG. 1 is a block diagram showing an exemplary configuration of a transmitter in a wireless communication system according to an embodiment of the present invention.

FIG. 1 is a block diagram showing an exemplary configuration of a transmitter 100 in a wireless communication system according to an embodiment of the present invention.

Figure 11:
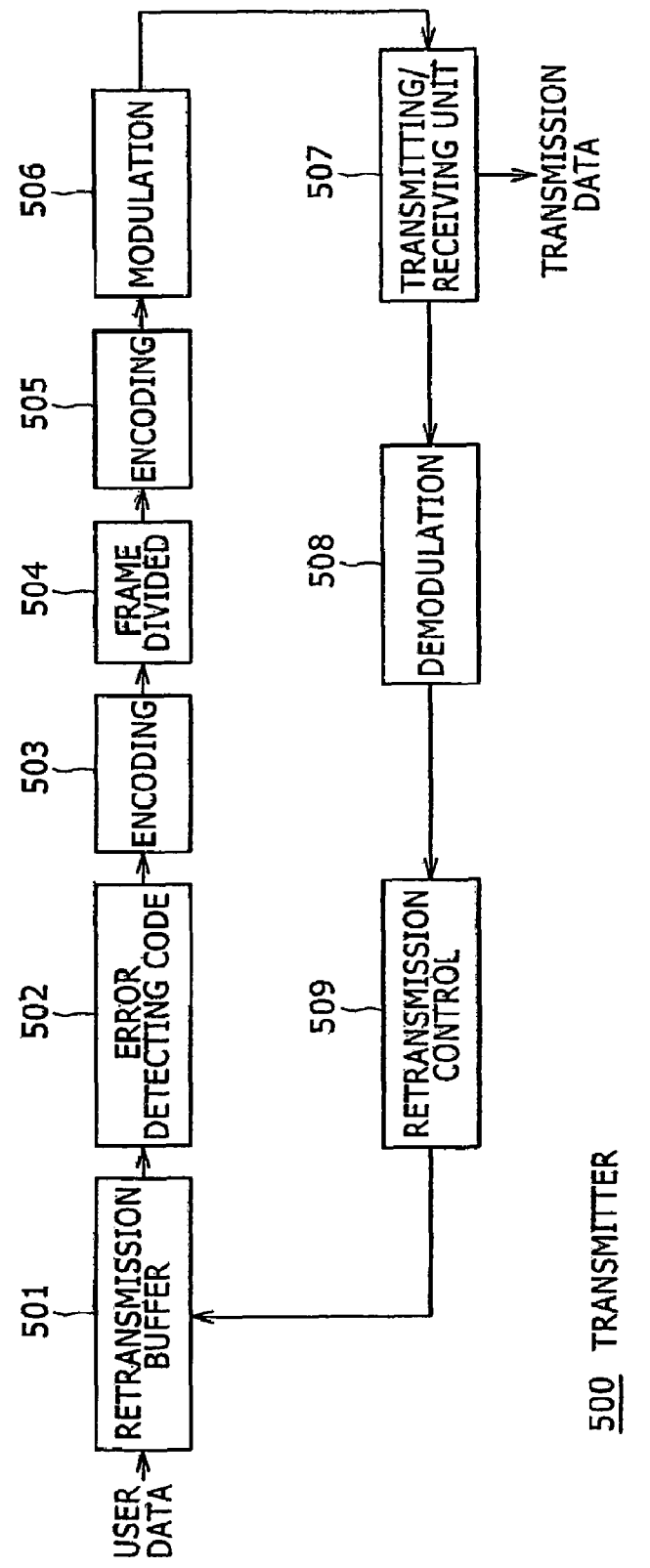
FIG. 11 is a block diagram showing an exemplary configuration of a conventional transmitter that uses a scheme for performing error correcting doubly.

A transmitter 100 includes a retransmission buffer 101, an error detecting code unit 102, an encoder 103 (by an outer code), a frame dividing unit 104, a retransmission buffer 110, an encoder 105 (by an inner code), a modulator 106, a transmitting/receiving unit 107, a demodulator 108, and a retransmission controller 109. Although the basic configuration of the transmitter 100 is similar to that of the transmitter 500 in FIG. 11, the transmitter 100 is different from the transmitter 500 in that the second retransmission buffer 110 for storing the divided data is provided besides the retransmission buffer 101 for storing the user data and the retransmission controller 109 controls both the retransmission buffers 101 and 110. The configuration and operation of the transmitter 100 in FIG. 1 will be described below.

New user data to be transmitted is temporarily stored in the retransmission buffer 101. If data to be transmitted is new data, the transmitter 100 transmits the stored data. If data to be transmitted is retransmission data, the transmitter 100 transmits the past stored data. The error detecting code unit 102 adds an error detecting code (such as CRC) to transmission data. The encoder 103 encodes the transmission data to which the error detecting code is added, using an error correcting code of an outer code. A Reed-Solomon code, a Bose-Chaudhuri-Hocquenghem code (BCH code), etc. are used as the outer code. The data encoded by the encoder 103 is divided into M blocks at a frame dividing unit 104. The retransmission buffer 110 stores each of the divided data pieces. In accordance with control of the retransmission controller 109, the retransmission buffer 110 outputs the stored data blocks. The encoder 105 encodes each of the divided data pieces from the retransmission buffer 110 using a second error correcting code of an inner code. A convolutional code, a turbo code, etc. are used as the inner code. The data encoded by the encoder 105 is modulated by a modulator 106, and the modulated data is transmitted to a transmission line through a transmitting/receiving unit 107. The data received by the transmitting/receiving unit 107 is demodulated by the demodulator 108, and the resulting data is sent to the retransmission controller 109.

The retransmission controller 109 discriminates between an inner-code retransmission and an outer-code retransmission, and transmits the data stored in the retransmission buffer 110 in the case of the inner-code retransmission. In the case of the outer-code retransmission, the data stored in the retransmission buffer 101 is transmitted. If ACK is obtained for an inner-code block, the retransmission controller 109 clears the corresponding data in the retransmission buffer 110. If ACK is obtained for outer-code frame data, the retransmission controller 109 clears the corresponding data in the retransmission buffer 101.

Figure 2:
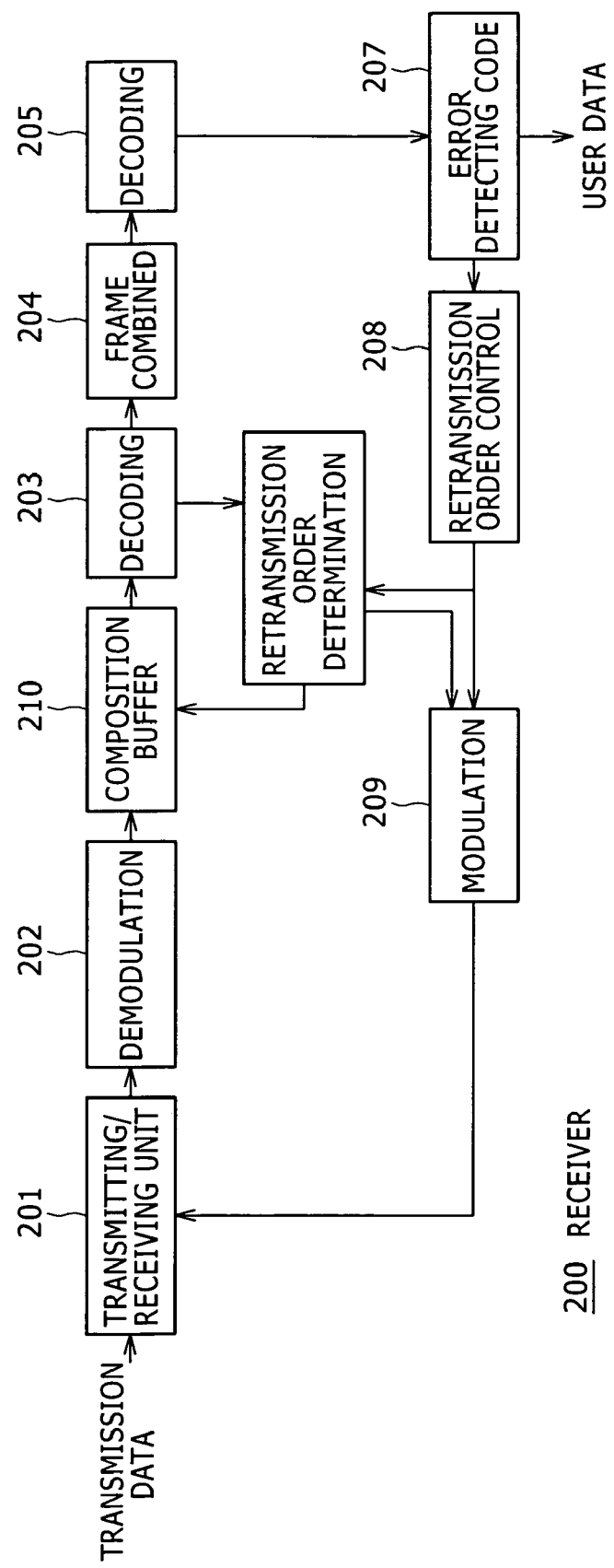
FIG. 2 is a block diagram showing an example of a receiver corresponding to the transmitter of FIG. 1.

FIG. 2 shows an example of a receiver 200 corresponding to the transmitter 100 of FIG. 1.

Figure 12:
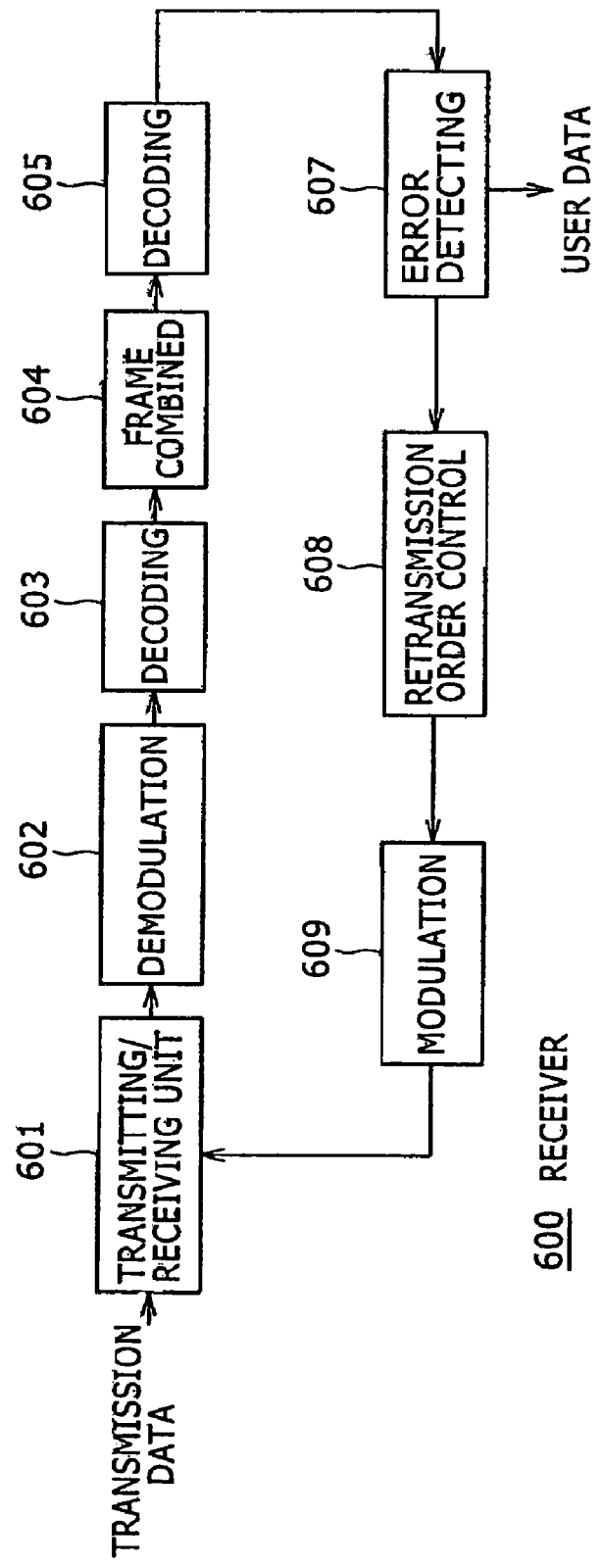
FIG. 12 is a block diagram showing an exemplary configuration of a receiver corresponding to the transmitter of FIG. 11.
Figure 13:
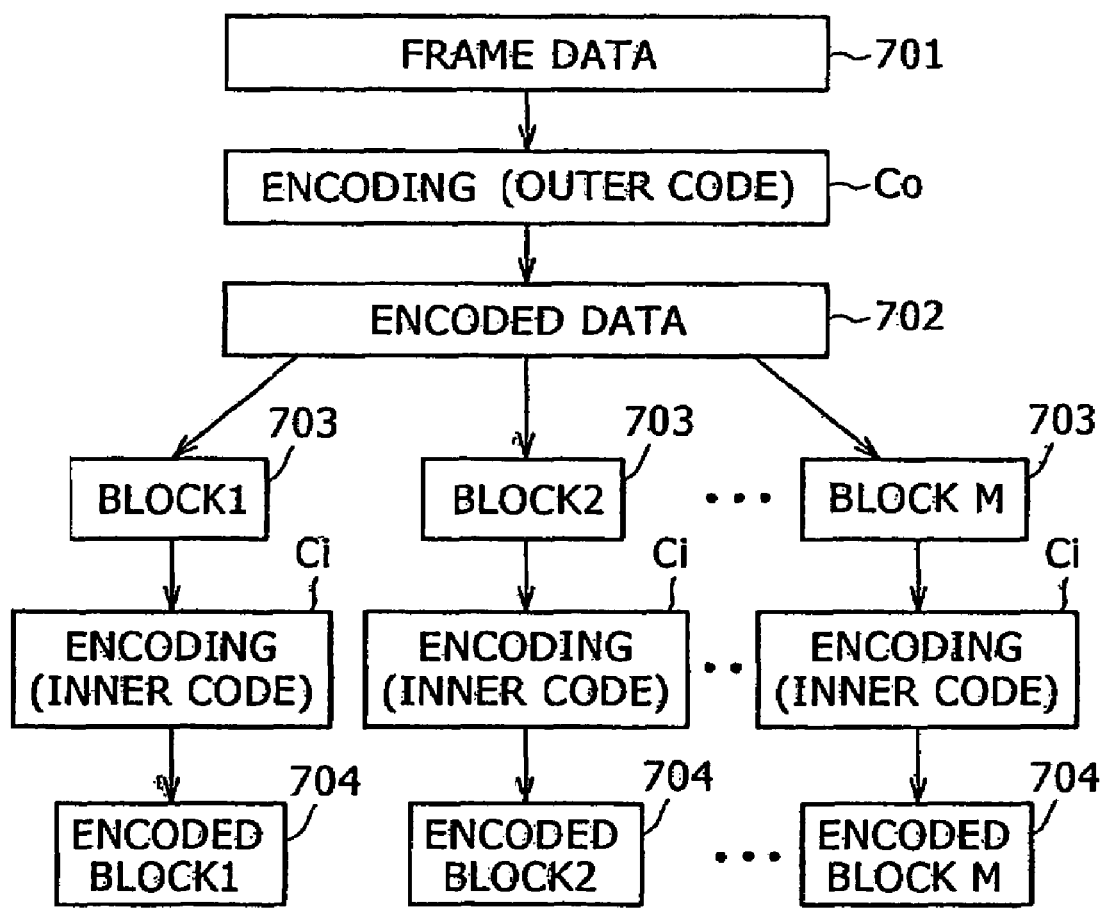
FIG. 13 is a diagram showing schematically a relationship between frame data and divided blocks in the transmitter of FIG. 11.

The receiver 200 includes a transmitting/receiving unit 201, a demodulator 202, a composition buffer 210, a decoder 203, a frame combining unit 204, a decoder 205, an error detector 207, a retransmission order controller 208, a modulator 209, and a retransmission order determining unit 211. Although the configuration of the receiver 200 is similar to that of the receiver 600 shown in FIG. 12, the receiver 200 is different from the receiver 600 in that the composition buffer 210 is provided after the demodulator 202 and also the retransmission order determining unit 211 is added.

The transmission data received by a transmitting/receiving unit 201 is detected and demodulated by a demodulator 202. The composition buffer 210 stores each of the inner-code blocks demodulated. In the case of retransmission data, the past stored data is added to the retransmission data and the added data is stored in the composition buffer 210. The decoder 203 decodes each of the divided data blocks outputted from the composition buffer 210. The decoder 203 outputs likelihood information on each data bit of the decode result to the retransmission order determining unit 211 in a manner described later. The frame combining unit 204 combines M blocks of the data decoded by the decoder 203 and creates a data frame which is decoded at a decoder 205. The error detector 207 determines whether there is an error in the decoded data using the error detecting code. If there is no error, the error detector 207 outputs the decoded data as user data. The retransmission order controller 208 creates ACK if the error detector 207 determines that there is no error, or NACK if the error detector 207 detects an error. The modulator 209 modulates a retransmission control message received from the retransmission order controller 208, and the transmitting/receiving unit 201 transmits the message. A detailed description will be made later as to functions of the retransmission order determining unit 211 which is a characteristic function unit in this embodiment.

Figure 3:
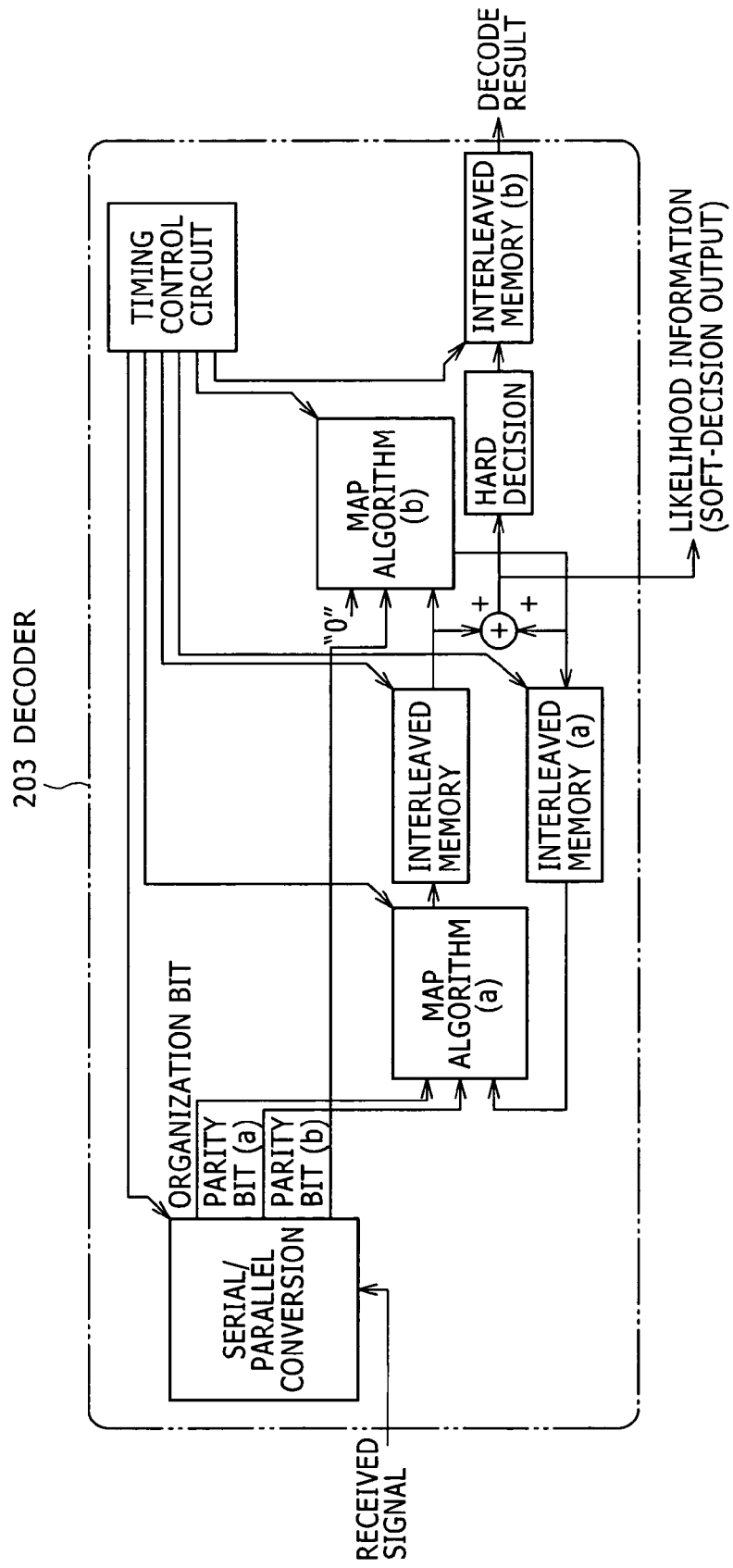
FIG. 3 is a block diagram showing an exemplary configuration of the decoder in the receiver shown in FIG. 2.

FIG. 3 is a block diagram showing an exemplary configuration of the decoder 203. This is an example in the case of using a turbo code with R=1/3. Since the configuration and operation themselves are already known, a description thereof is omitted here.

The retransmission order determining unit 211 has the following functions.

Figure 4:
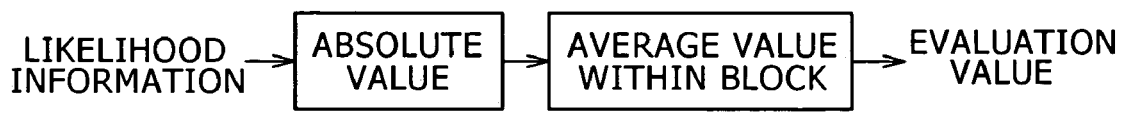
FIG. 4 is a diagram showing a calculation way of an evaluation value in an embodiment of the present invention.

(a) The retransmission order determining unit 211 derives evaluation values based on the likelihood information received from the decoder 203 in a manner shown in FIG. 4. An average value of absolute values of the likelihood information (decoded soft-decision values) within a block is used as an evaluation value. A correlation between the evaluation value and the number of errors in a decoded block is shown by a graph in FIG. 5. The horizontal axis of the graph denotes the number of error bits in a code block. The vertical axis denotes an average amplitude of soft-decision output values in a code block, that is, the evaluation value. "Eb/No" in FIG. 5 denotes a ratio of power density versus noise power density per bit in a digitally modulated signal. The graph shows that the number of errors decreases as the evaluation value increases. Therefore, it is possible to estimate whether or not the number of errors in the inner code is within error correction capability of the outer code based on this correlation.

Figure 5:
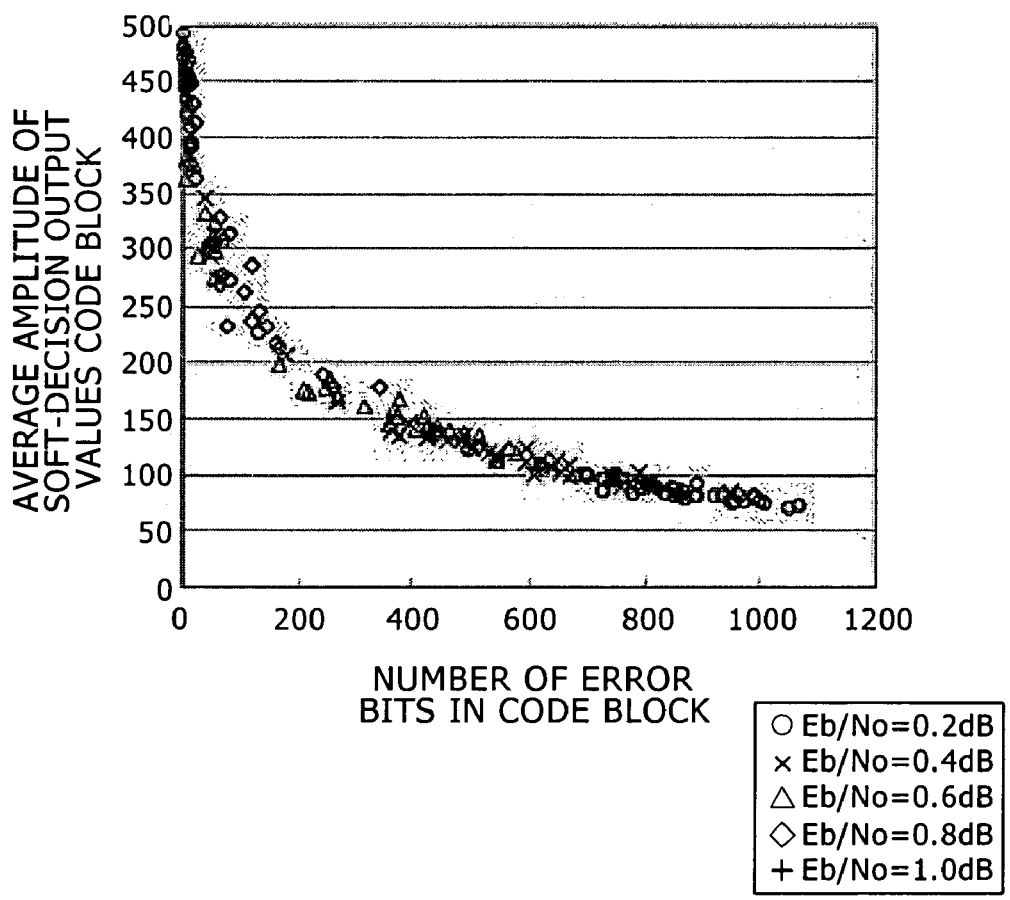
FIG. 5 is a graph showing a relationship between the evaluation value of FIG. 4 and the number of errors in a decoded block.

The retransmission order determining unit 211 determines a threshold value TH[0] for the evaluation value as to whether or not to perform a retransmission order for an inner-code block in the following way according to the error correction capability of the outer code. If the error correction capability of the outer code can correct N errors, the number of errors allocated to each inner code is N/M (M refers to the number of blocks divided from a frame as described above). In accordance with the relationship of FIG. 5, the evaluation value corresponding to N/M is determined to be the threshold value:

$$TH[0]=\text{func\_map}(N/M) \quad (1)$$

where "func_map( )" is a function derived from the relationship of FIG. 5 and outputs a value on the y-axis when an argument is a value on the x-axis. In reality, this is prepared with a data table, for example.

Comparing the evaluation value with the threshold value, if the evaluation value is not more than the threshold value, the retransmission order determining unit 211 performs the block retransmission order (NACK). If the evaluation value is not less than the threshold value, the retransmission order determining unit 211 determines that the data has been received correctly (ACK), and the data decoded by the decoder 203 is outputted to the frame combining unit 204.

(b) In order to maintain retransmission orders for the outer-code data at a constant rate, a threshold adjustment may be made to a decoded unit (each data frame code) of the outer code in the following manner.

In the case where there is an error at the outer code:

$$TH[t]=TH[t-1]+(1-\text{targetError})*\text{adjust} \quad (2)$$

In the case where there is no error at the outer code:

$$TH[t]=TH[t-1]-\text{targetError}*\text{adjust} \quad (3)$$

where "t" is an integral parameter indicating a time lapse according to a data frame, and "targetError" is a target value (a positive number less than 1) for the rate at which the retransmission order is performed in units of outer codes and a network operational parameter, and "adjust" is a predetermined threshold adjustment.

Equation (2) means that the block retransmission order occurs easily by raising the threshold value in the case where there is an error at the outer code. Equation (3) means that the block retransmission order occurs hard by lowering the threshold value in the case where there is no error at the outer code.

(c) In the case where the past block likelihood is high, it is acceptable that the likelihood required for the next block is low. Therefore, a threshold adjustment may be made in the following manner in accordance with an inner-code block number (m) constituting an outer-code data frame.

The number of block errors in a data frame is obtained on the basis of equation (4):

$$\text{total\_est\_error}[m] = \sum_{i=1}^{m} \text{est\_error}[i] \quad (4)$$

As shown by equation (5), an initial value of the threshold adjustment Δth[m] for each inner-code block in the data frame is set to zero. The threshold adjustment Δth[m] is updated by updating the number of errors (N/M) allocated to each inner code for the initial threshold value TH[0], in consideration of the number of accumulated errors (total_est_error [m]) in the data frame. The number of errors (est_error [m]) refers to the number of error bits on the horizontal axis that the calculated evaluation value on the vertical axis of the graph in FIG. 5 is converted into.

Δth [m]=0 for m=0

Δ*th[m]*=TH[0]−func_map((N−total_est_error[m])/
 (M−m)) elsewise (5)

With a value obtained by multiplying the updated threshold adjustment Δth[m] by a predetermined coefficient "alpha" (a positive number not more than 1), the threshold value TH[t, m] for each inner-code block is updated as shown by equation (6). The updating is performed by decreasing the initial threshold value of the frame TH[t, 0] in accordance with Δth[m].

*TH[t,m]*=TH[t, 0]−alpha*Δ*th[m]* (6)

If there are few inner-code errors at early time in the frame, the outer-code error correction can cover them even in the case of lowering the frequency of occurrence of the block retransmission order; therefore, the margin can be delivered to the subsequent block in the frame. That is, for the subsequent block, the threshold value is lowered so that ACK occurs easily and the block retransmission order occurs hard.

Figure 6:
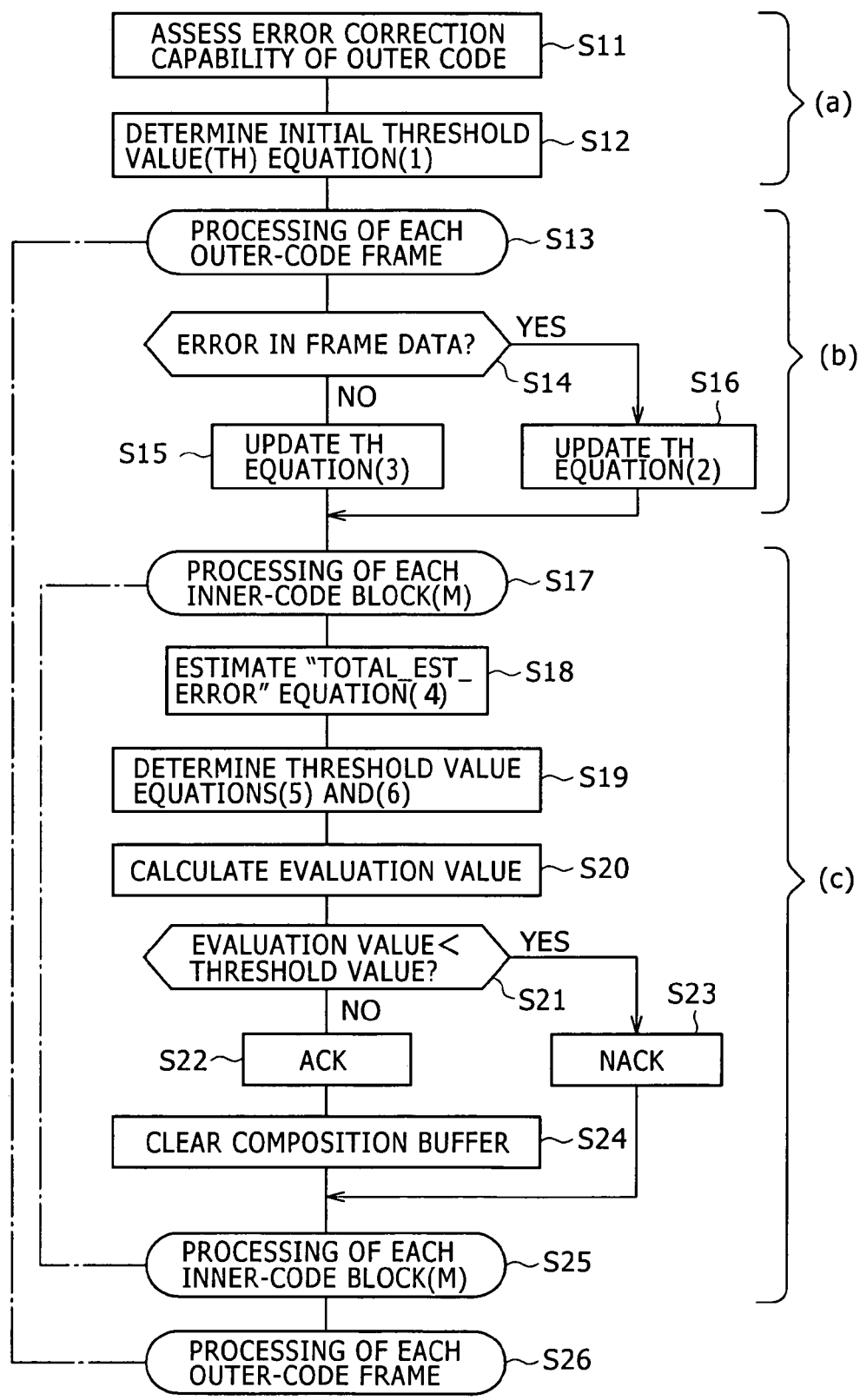
FIG. 6 is a flowchart showing an exemplary process of a retransmission order determining unit in a receiver shown in FIG. 2.

FIG. 6 is a flowchart showing an exemplary process of the retransmission order determining unit 211. First, the retransmission order determining unit 211 assesses the error correction capability of the outer code (S11). This corresponds to the foregoing correction capability for N errors. Next, the initial threshold value (TH [0]) is determined with equation (1) (S12).

Next, the process moves to processing of each outer-code frame (S13 to S26). In the processing of each outer-code frame, the retransmission order determining unit 211 checks for the presence or absence of an error in the frame data (S14). If there is an error in the frame data, the threshold value TH is updated with equation (2) (S16). If there is no error in the frame data, the threshold value TH is updated with equation (3) (S15).

Next, the process moves to processing of each inner-code block (S17 to S25). First, there transmission order determining unit 211 estimates "total_est_error[m]" as shown by equation (4) (S18), and determines the threshold value TH [t,m] according to equations (5) and (6) (S19).

Next, the retransmission order determining unit 211 calculates the evaluation value (S20), and compares the calculated evaluation value with the threshold value TH[t,m] (S21). If the evaluation value is less than the threshold value, the block retransmission order (NACK) is performed (S23). If the evaluation value is equal to or more than the threshold value, ACK is performed and the block retransmission order is not performed (S22), and the composition buffer is cleared (S24). The process of S18 to S24 is repeated for each inner-code block.

The process of FIG. 6 is an example into which all of the functions (a), (b), and (c) of the retransmission order determining unit 211 are combined. Instead of this, only function (a), a combination of functions (a) and (b), and a combination of functions (b) and (c) may be employed.

Figure 7:
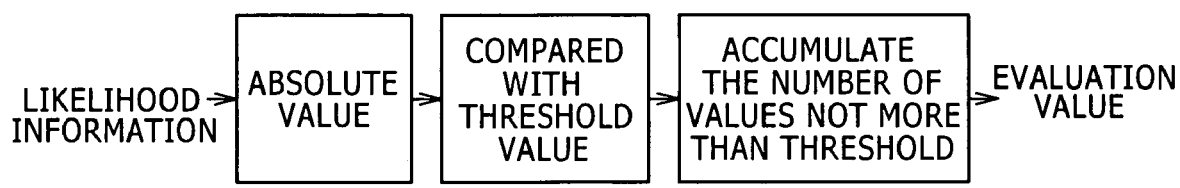
FIG. 7 is a diagram showing another calculation way of an evaluation value in an embodiment of the present invention.

The evaluation value has been determined in the manner shown in FIG. 4; however, this can be done in a manner shown in FIG. 7. That is, absolute values of the likelihood information (decoded soft-decision values) are compared to a specified threshold value, and the total number of absolute values not more than the threshold value is determined to be an evaluation value.

Figure 8:
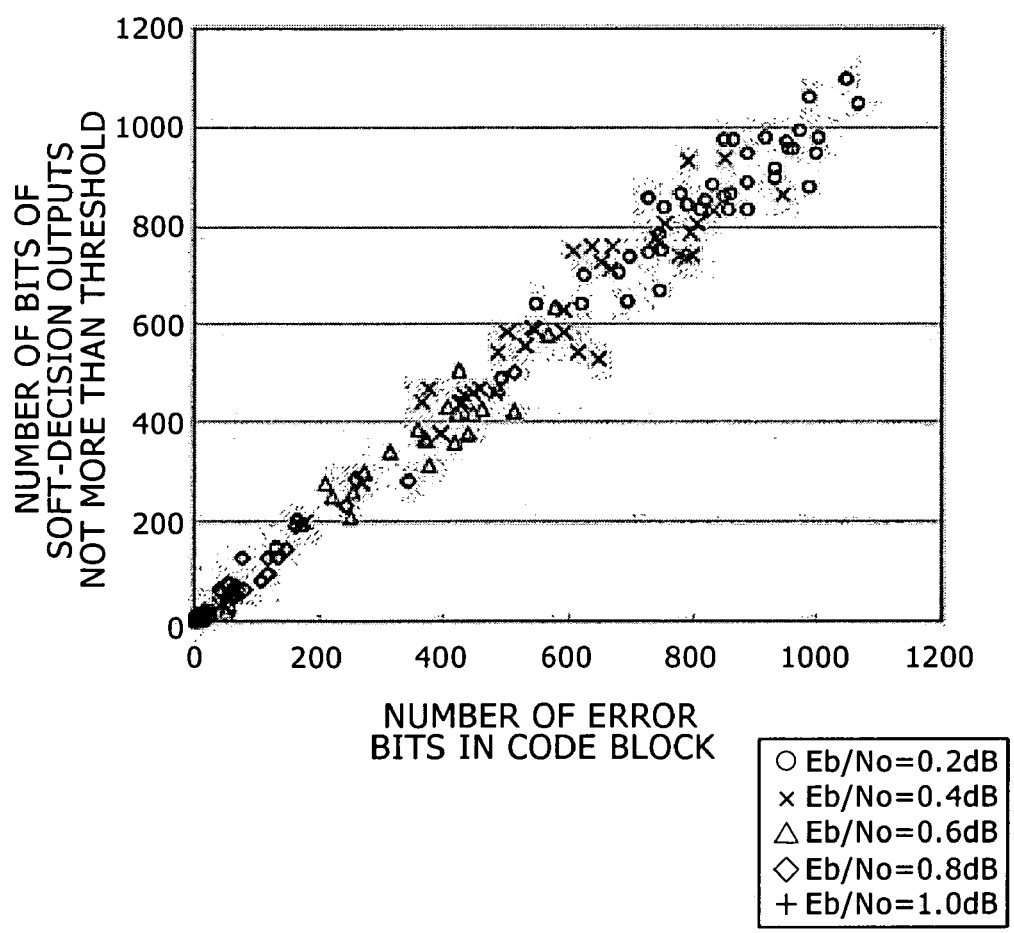
FIG. 8 is a graph showing a relationship between the evaluation value of FIG. 7 and the number of errors in a decoded block.
Figure 9:
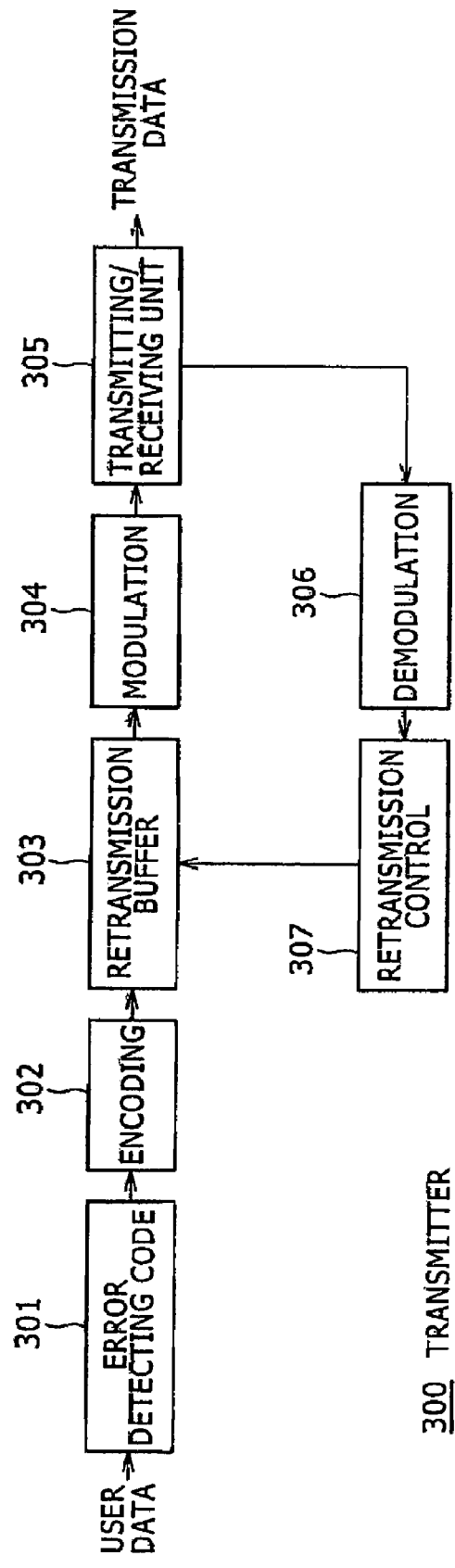
FIG. 9 is a block diagram showing an exemplary configuration of a transmitter for realizing a conventional retransmission scheme.
Figure 10:
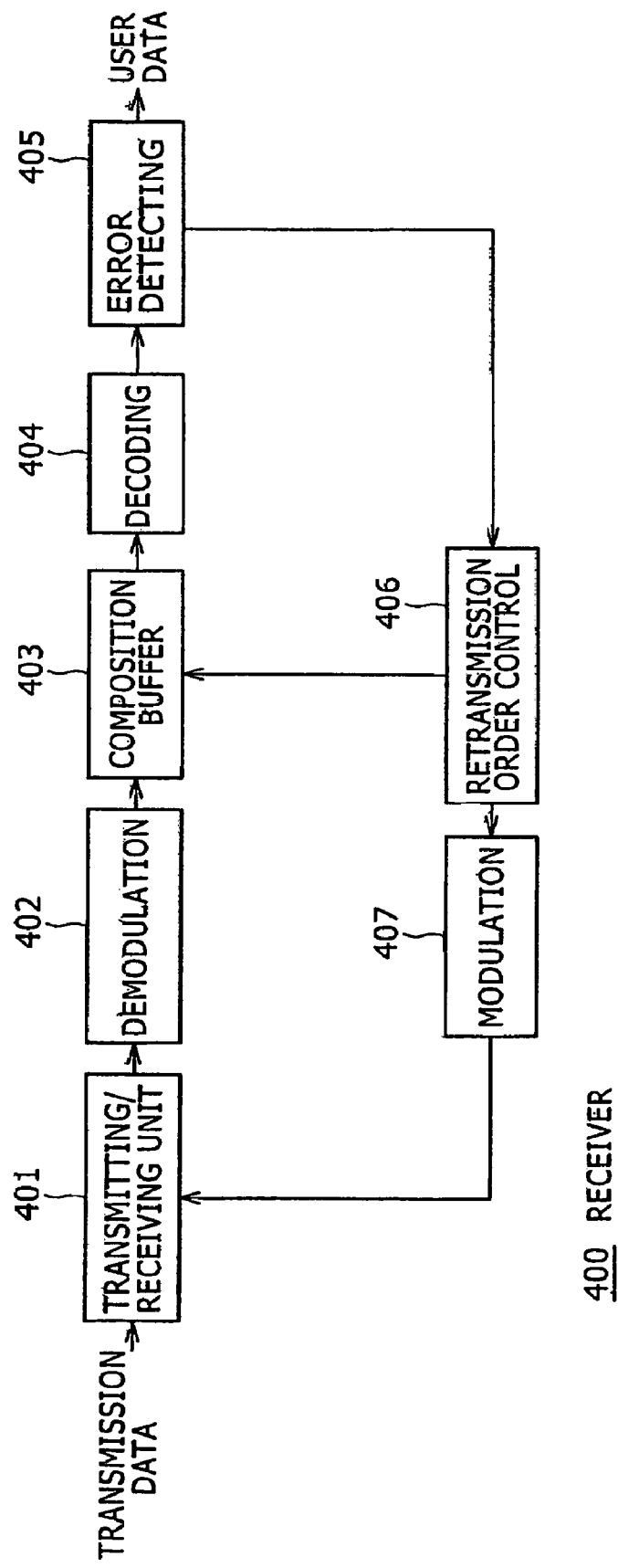
FIG. 10 is a block diagram showing an exemplary configuration of a receiver, which corresponds to the transmitter of FIG. 9, for realizing a conventional retransmission scheme.

In this case, a relationship between the evaluation value and the number of errors in a decoded block is shown by a graph in FIG. 8. The graph shows the relationship that the number of errors in a block decreases as the evaluation value decreases. In the case of using the evaluation value as described, the operation of the retransmission order determining unit 211 is basically the same. However, since the correlation turns positive from negative, equations (2), (3), and (6) need to be changed to equations (2)', (3)', and (6)' respectively.

*TH[t]*=*TH[t*−1]−(1−targetError)*adjust (2)'

*TH[t]*=*TH[t*−1]+targetError*adjust (3)'

*TH[t,m]*=*TH[t*, 0]+alpha*Δ*th[m]* (6)'

In the foregoing, the detailed description has been made of the preferred embodiments of the present invention, but various modifications and changes can be made besides the above-described embodiments. For example, since some systems can tolerate errors present in the error detector 207 in FIG. 2, it is not necessarily essential in the present invention that the retransmission order controller 208 creates the retransmission order in units of data frames.

It should be understood by those skilled in the art that various modifications, combinations, sub-combinations and alterations may occur depending on design requirements and other factors insofar as they are within the scope of the appended claims or the equivalents thereof.

The invention claimed is:

1. A retransmission ordering method in a receiver for receiving transmission data by wireless, frame data being encoded with an outer code and then divided into predetermined number of blocks which are encoded with an inner code into the transmission data, the retransmission ordering method comprising the steps of:

receiving transmission data;

storing received transmission data in a buffer;

decoding the transmission data stored in the buffer in accordance with the inner code and outputting a decode result and likelihood information thereof;

creating frame data by combining decoded blocks;

decoding the frame data in accordance with the outer code;

determining whether to perform a retransmission order in units of blocks based on the likelihood information; and transmitting a retransmission order for an applicable block if it is determined that a retransmission is necessary according to the step of determining whether to perform a retransmission order, wherein at the step of determining whether to perform a retransmission order, the retransmission order for the block is inhibited if the number of inner-code errors in a frame consisting of the predetermined number of blocks stays within a limit of what the outer code can correct and it is determined that a retransmission is necessary if the number of inner-code errors in the frame exceeds the limit.

2. The retransmission ordering method according to claim 1,
wherein the step of determining whether to perform a retransmission order comprises the steps of:
finding an average value of absolute values of the likelihood information within a block as an evaluation value; and
determining whether the block needs to be retransmitted by comparing the evaluation value with a predetermined threshold value.

3. The retransmission ordering method according to claim 2,
wherein an evaluation value corresponding to the number of errors N/M allocated to each inner code is the predetermined threshold value in the case where error correction capability of the outer code can correct N errors and one piece of frame data is divided into M pieces.

4. The retransmission ordering method according to claim 3,
an error detecting code being added to the frame data which is then encoded with the outer code, the retransmission ordering method further comprising the steps of:
performing error detection for a decode result in accordance with the error detecting code after frame data obtained by decoding in accordance with the inner code is decoded in accordance with the outer code; and
changing the predetermined threshold value in units of data frames so that the retransmission order for the block occurs if an error is detected in the step of performing error detection and in such a way that the retransmission order for the block occurs if no error is detected.

5. The retransmission ordering method according to claim 3, further comprising the step of:
changing the predetermined threshold value in units of blocks in a data frame using a threshold adjustment updated by updating the number of errors N/M allocated to each inner code based on the number of accumulated errors as to sequential blocks in one data frame.

6. The retransmission ordering method according to claim 1,
wherein the step of determining whether to perform a retransmission order comprises the steps of:
finding the number of bits that lead to absolute values of the likelihood information that are not more than a specified threshold value, as an evaluation value; and
determining whether the block needs to be retransmitted by comparing the evaluation value with a predetermined threshold value.

7. The retransmission ordering method according to claim 6,
wherein an evaluation value corresponding to the number of errors N/M allocated to each inner code is the predetermined threshold value in the case where error correction capability of the outer code can correct N errors and one piece of frame data is divided into M pieces.

8. The retransmission ordering method according to claim 1,
an error detecting code being added to the frame data which is then encoded with the outer code, the retransmission ordering method further comprising the steps of:
performing error detection for a decode result in accordance with the error detecting code after frame data obtained by decoding in accordance with the inner code is decoded in accordance with the outer code; and
transmitting a retransmission order for applicable frame data in accordance with an error detection result in the step of performing error detection.

9. A wireless communication system comprising
a transmitter and
a receiver,
wherein after encoding frame data with an outer code, the transmitter divides the frame data into predetermined number of blocks which are further encoded with an inner code, and the transmitter transmits the encoded data to the receiver by wireless; and
wherein the receiver receives transmitted data, stores received data in a buffer, decodes transmission data stored in the buffer in accordance with the inner code, creates frame data by combining decoded blocks, decodes the frame data in accordance with the outer code, outputs a decode result and likelihood information thereof, determines whether to perform a retransmission order in units of blocks based on the likelihood information, and transmits a retransmission order for an applicable block if it is determined that a retransmission is necessary based on the determining whether to perform a retransmission order, and in the case of determining whether to perform a retransmission order, the receiver inhibits the retransmission order for the block if the number of inner-code errors in a frame consisting of the predetermined number of blocks stays within a limit of what the outer code can correct and determines that a retransmission is necessary if the number of inner-code errors in the frame exceeds the limit.

10. A receiver for receiving transmission data by wireless, frame data being encoded with an outer code and then divided into predetermined number of blocks which are encoded with an inner code into the transmission data, the receiver comprising:
a buffer for storing received transmission data;
first decoding means for decoding the transmission data stored in the buffer in accordance with the inner code and outputting a decode result and likelihood information thereof;
frame combining means for creating frame data by combining decoded blocks;
second decoding means for decoding the frame data in accordance with the outer code;
retransmission order determining means for determining whether to perform a retransmission order in units of blocks based on the likelihood information from the first decoding means; and
retransmission order transmitting means for transmitting a retransmission order for an applicable block if the retransmission order determining means determines that a retransmission is necessary,
wherein the retransmission order determining means inhibits the retransmission order for the block if the number of inner-code errors in a frame consisting of the predetermined number of blocks stays within a limit of what the outer code can correct at the second decoding means and determines that a retransmission is necessary if the number of inner-code errors in the frame exceeds the limit.

11. The receiver according to claim 10,
wherein the retransmission order determining means comprises:

means for finding an average value of absolute values of the likelihood information within a block as an evaluation value; and means for determining whether the block needs to be retransmitted by comparing the evaluation value with a predetermined threshold value.

12. The receiver according to claim 10, wherein the retransmission order determining means comprises:

means for finding the number of bits that lead to absolute values of the likelihood information that are not more than a specified threshold value, as an evaluation value; and means for determining whether the block needs to be retransmitted by comparing the evaluation value with a predetermined threshold value.

13. The receiver according to claim 11, wherein an evaluation value corresponding to the number of errors N/M allocated to each inner code is the predetermined threshold value in the case where error correction capability of the outer code can correct N errors and one piece of frame data is divided into M pieces.

14. The receiver according to claim 13, an error detecting code being added to the frame data which is then encoded with the outer code, the receiver further comprising:

error detecting means for performing error detection in accordance with the error detecting code; and first threshold changing means for changing the predetermined threshold value in units of data frames in such a way that the retransmission order for the block occurs if the error detecting means detects an error and in such a way that the retransmission order for the block occurs if the error detecting means detects no error.

15. The receiver according to claim 13, further comprising second threshold changing means for changing the predetermined threshold value in units of blocks in a data frame using a threshold adjustment updated by updating the number of errors N/M allocated to each inner code based on the number of accumulated errors as to sequential blocks in one data frame.

16. The receiver according to claim 12, wherein an evaluation value corresponding to the number of errors N/M allocated to each inner code is the predetermined threshold value in the case where error correction capability of the outer code can correct N errors and one piece of frame data is divided into M pieces.

17. The receiver according to claim 10, an error detecting code being added to the frame data which is then encoded with the outer code, the receiver further comprising:

error detecting means for performing error detection in accordance with the error detecting code; and retransmission order controlling means for creating a retransmission order for applicable frame data in accordance with an error detection result by the error detecting means.

* * * * *